United States Patent
Peng

(10) Patent No.: US 9,524,665 B2
(45) Date of Patent: Dec. 20, 2016

(54) DISPLAY PANEL AND GATE DRIVER

(71) Applicants: AU Optronics (Xiamen) Corporation, Xiamen (CN); AU Optronics Corporation, Hsin-Chu (TW)

(72) Inventor: Shao-Peng Peng, Xiamen (CN)

(73) Assignees: AU OPTRONICS (XIAMEN) CORPORATION, Xiamen (CN); AU OPTRONICS CORPORATION, Hsin-Chu (TW)

(*) Notice: Subject to any disclaimer, the term of this patent is extended or adjusted under 35 U.S.C. 154(b) by 181 days.

(21) Appl. No.: 14/517,137

(22) Filed: Oct. 17, 2014

(65) Prior Publication Data

US 2015/0235590 A1    Aug. 20, 2015

(30) Foreign Application Priority Data

Feb. 17, 2014  (CN) .......................... 2014 1 0052658

(51) Int. Cl.
*G11C 19/00*   (2006.01)
*G09G 3/20*    (2006.01)
*G11C 19/28*   (2006.01)
*G09G 3/36*    (2006.01)

(52) U.S. Cl.
CPC .......... *G09G 3/2092* (2013.01); *G09G 3/3674* (2013.01); *G11C 19/28* (2013.01); *G09G 2310/0286* (2013.01); *G09G 2330/027* (2013.01)

(58) Field of Classification Search
CPC .............................. G11C 19/28; G09G 3/2092
See application file for complete search history.

(56) References Cited

U.S. PATENT DOCUMENTS

| | | | | |
|---|---|---|---|---|
| 8,023,613 B2* | 9/2011 | Tsai | ...................... | G09G 3/3677 377/64 |
| 8,571,169 B2* | 10/2013 | Tobita | .................. | G09G 3/3677 377/64 |
| 8,614,661 B2* | 12/2013 | Tan | ...................... | G09G 3/3677 345/100 |
| 8,831,167 B2* | 9/2014 | Liu | ........................ | G11C 19/28 377/64 |
| 9,183,781 B2* | 11/2015 | Jang | ..................... | G09G 3/3266 |
| 2008/0055225 A1* | 3/2008 | Pak | ....................... | G09G 3/3677 345/96 |
| 2008/0219401 A1* | 9/2008 | Tobita | .................. | G09G 3/3677 377/79 |
| 2010/0085294 A1 | 4/2010 | Otose | | |

(Continued)

FOREIGN PATENT DOCUMENTS

CN    101719382    6/2010
CN    102855858    1/2013

(Continued)

*Primary Examiner* — Ryan Jager
(74) *Attorney, Agent, or Firm* — WPAT, PC; Justin King

(57) ABSTRACT

A display panel and a gate driver are disclosed. The gate driver includes a plurality of drive circuits. Each drive circuit includes a shift register unit and a select unit. The shift register unit is configured to generate a driving signal. The select unit is electrically coupled to the shift register unit, and is configured to receive the driving signal and to output the driving signal to one of a plurality of gate lines according to a clock signal. An enabling interval of the driving signal is an N-th power of 2 times a period of the clock signal, in which N is 0 or a positive integer.

10 Claims, 9 Drawing Sheets

(56) References Cited

U.S. PATENT DOCUMENTS

| | | | |
|---|---|---|---|
| 2012/0050234 A1* | 3/2012 | Jang | G09G 3/3225 345/204 |
| 2012/0075279 A1 | 3/2012 | Ishida | |
| 2013/0106826 A1 | 5/2013 | Zhou et al. | |

FOREIGN PATENT DOCUMENTS

| | | |
|---|---|---|
| CN | 102881248 A | 1/2013 |
| JP | 2005-321510 A | 11/2005 |
| TW | 201040912 | 11/2010 |

* cited by examiner

DISPLAY PANEL AND GATE DRIVER

RELATED APPLICATIONS

This application claims priority to Chinese Application Serial Number 201410052658.7, filed Feb. 17, 2014, which is herein incorporated by reference.

BACKGROUND

Technical Field

The present disclosure relates to a display panel. More particularly, the present disclosure relates to a gate driver of the display panel.

Description of Related Art

Various liquid crystal display (LCD) products have become quite popular in recent times. In order to increase the viewable image size of LCD devices effectively, techniques applicable to slim border display panels have been provided.

However, with the higher and higher resolution and slimmer and slimmer border requirements associated with modern product specifications, difficulties are encountered with respect to the conventional gate driver meeting the required specifications. As a result, the border width of a display panel is still limited to the area of the gate driver.

Therefore, designing a structure of a gate driver that is applicable to a slim border display panel is an important research topic and a targeted area of improvement in the relevant field.

SUMMARY

One aspect of the present disclosure is related to a gate driver including a plurality of drive circuits, each drive circuit includes a shift register unit configured to generate a driving signal and a select unit electrically coupled to the shift register unit and configured to output the driving signal to one of a plurality of gate lines according to clock signal. An enabling interval of the driving signal is an N-th power of 2 times a period of clock signal, in which N is 0 or a positive integer.

Another aspect of the present disclosure is related to a display panel. The display panel includes a plurality of gate lines arranged sequentially from top to bottom, and a gate driver configured to drive the plurality of gate lines sequentially. The gate driver includes a plurality of drive circuits, and a T-th drive circuit includes one input unit, one shift register unit, and one select unit, in which T is a positive integer. The input unit includes a first transmission terminal, a second transmission terminal, a first input terminal configured to receive an upshift signal, a second input terminal configured to receive a downshift signal, and an output terminal. The shift register unit includes a first input terminal electrically coupled to the output terminal of the input unit, a second input terminal configured to receive a system clock signal, and an output terminal electrically coupled to the second transmission terminal of a (T−1)-th drive circuit and the first transmission terminal of a (T+1)-th drive circuit. The select unit includes a first input terminal electrically coupled to the output terminal of the shift register unit, a second input terminal configured to receive a first clock signal, a first output terminal electrically coupled to a first gate line of the plurality of gate lines and a second output terminal electrically coupled to a second gate line of the plurality of gate lines.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
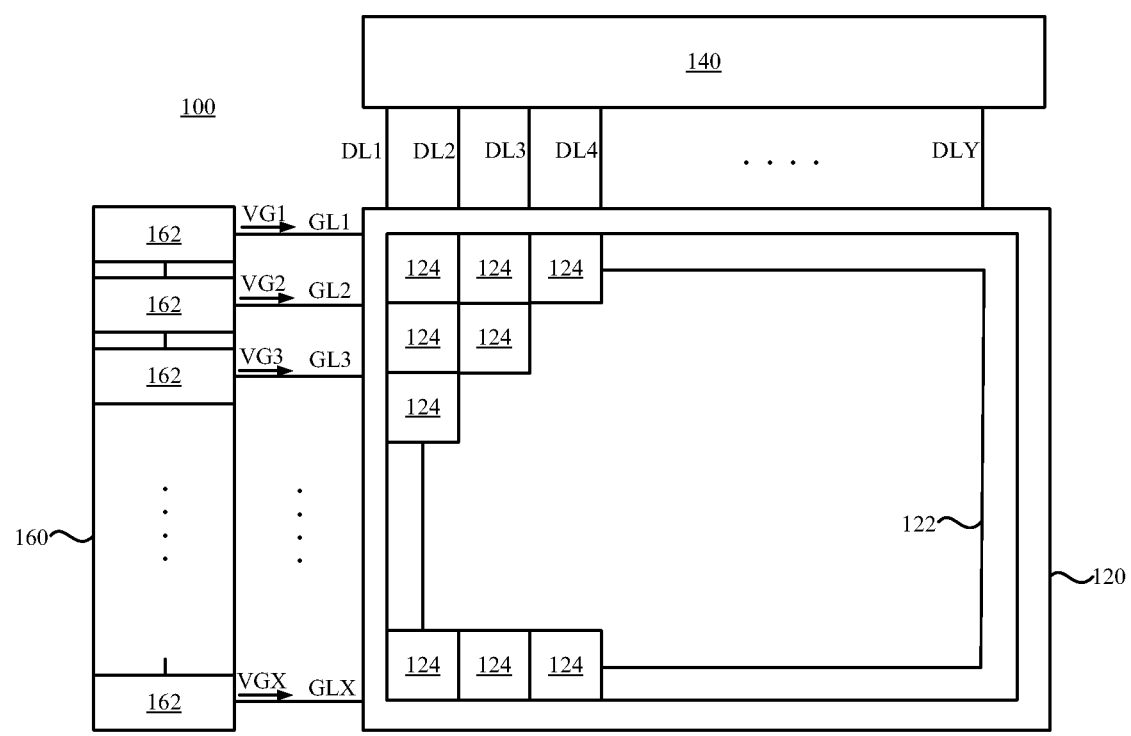
FIG. 1 is a diagram illustrating a known display panel.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. The size ratio between elements in the drawings is only used for understanding, and not meant to limit the actual embodiments of the present disclosure in scale. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to one of ordinary skill in the art regarding the description of the disclosure.

As used herein, "around," "about," "approximately" or "substantially" shall generally mean within 20 percent, preferably within 10 percent, and more preferably within 5 percent of a given value or range. Numerical quantities given herein are approximate, meaning that the term "around," "about," "approximately" or "substantially" can be inferred if not expressly stated, or meaning other approximate values.

As used herein, the terms "first," "second," etc. do not refer to any specific order, nor are they intended to limit the present disclosure, and are only used for distinguishing the differences between components or operations with the same technological descriptions.

In the following description and in the claims, the terms "include" and "comprise" are used in an open-ended fashion, and thus should be interpreted to mean "include (or comprise), but not limited to including (or comprising)."

Also, the term "coupled" or "connected" may refer to two or more elements being in direct physical or electrical contact, or in indirect physical or electrical contact via other devices and connections, and may also refer to two or more elements cooperating or interacting with each other.

FIG. 1 is a diagram illustrating a known display panel. The known display panel 100 includes an image display area 120, a source driver 140 and a gate driver 160.

Image display area 120 includes a pixel array 122 in a staggered arrangement of Y data lines DL1-DLY and X gate lines GL1-GLX, in which pixel array 122 includes a plurality of pixels 124.

Source driver 140 is electrically coupled to Y data lines DL1-DLY and is configured to output a plurality of data signals through data lines DL1-DLY to corresponding pixels 124 in image display area 120.

Gate driver 160 includes a plurality of drive circuits 162, and is electrically coupled to gate lines GL1-GLX. The plurality of drive circuits 162 are configured to generate driving signals VG1-VGX sequentially corresponding to gate lines GL1-GLX respectively, and are configured to drive gate lines GL1-GLX sequentially.

Figure 2:
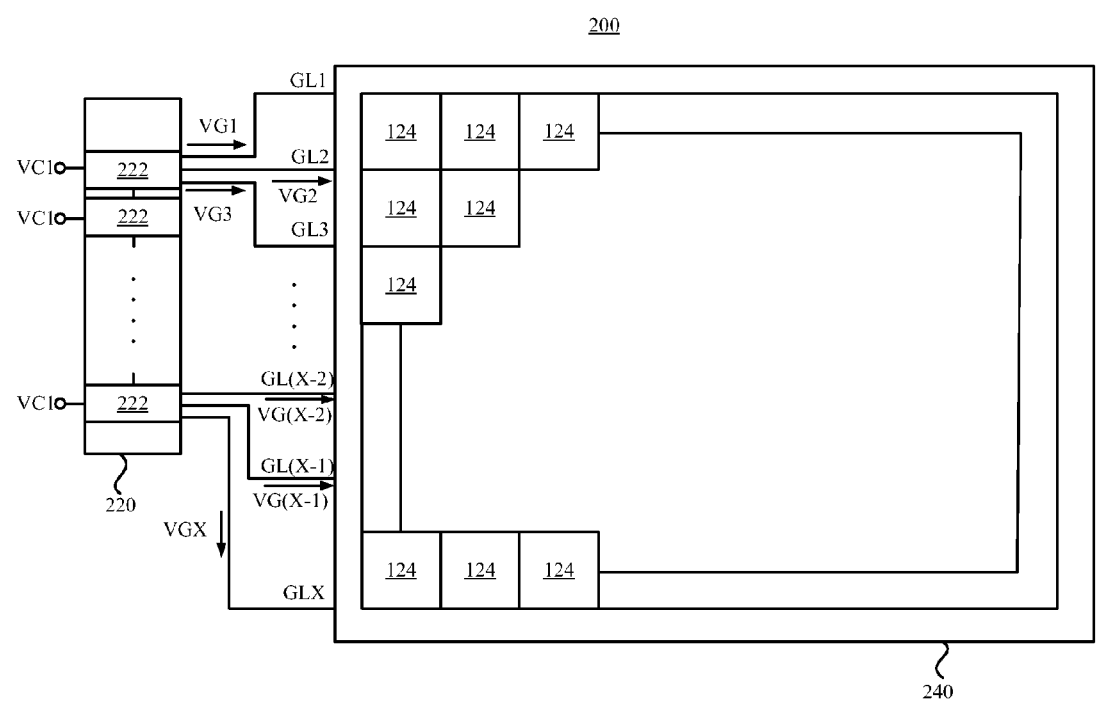
FIG. 2 is a diagram illustrating a display panel according to an embodiment of the present disclosure.

FIG. 2 is a diagram illustrating a display panel according to an embodiment of the present disclosure. As shown in FIG. 2, display panel 200 includes a plurality of gate lines GL1-GLX, a gate driver 220 and an image display area 240.

Gate lines GL1-GLX are arranged sequentially from top to bottom and are electrically coupled to image display area 240 and gate driver 220. In the present embodiment, the structure of image display area 240 is similar to the aforementioned image display area 120, and a description thereof is omitted herein for the sake of the brevity.

Gate driver 220 is configured to drive gate lines GL1-GLX and includes a plurality of drive circuits 222. In the present embodiment, each of drive circuits 222 is configured to generate at least one driving signal VG1-VGX to drive at least one gate lines GL1-GLX, and an enabling interval of driving signals VG1-VGX is the N-th power of 2 times a period of a first clock signal VC1, in which N is zero or a positive integer.

For instance, as shown in FIG. 2, the first drive circuit 222 that appears first in gate driver 220 is configured to drive gate lines GL1-GL3, and the N-th drive circuit 222 that appears last in gate driver 220 is configured to drive gate lines GL(X-2)-GLX. Alternatively stated, one of drive circuits 222 of gate driver 220 disclosed in the present embodiment may be configured to drive two or more gate lines. Compared to gate driver 160 shown in FIG. 1, gate driver 220 has a smaller circuit area with the same number of gate lines, and therefore, is configured such that display panel 200 is more applicable to products with slim borders.

Several embodiments configured to implement functions and operations of the aforementioned gate drive 220 are disclosed in the following paragraphs. It is noted that the disclosure is not limited to the embodiments below.

Figure 3A:
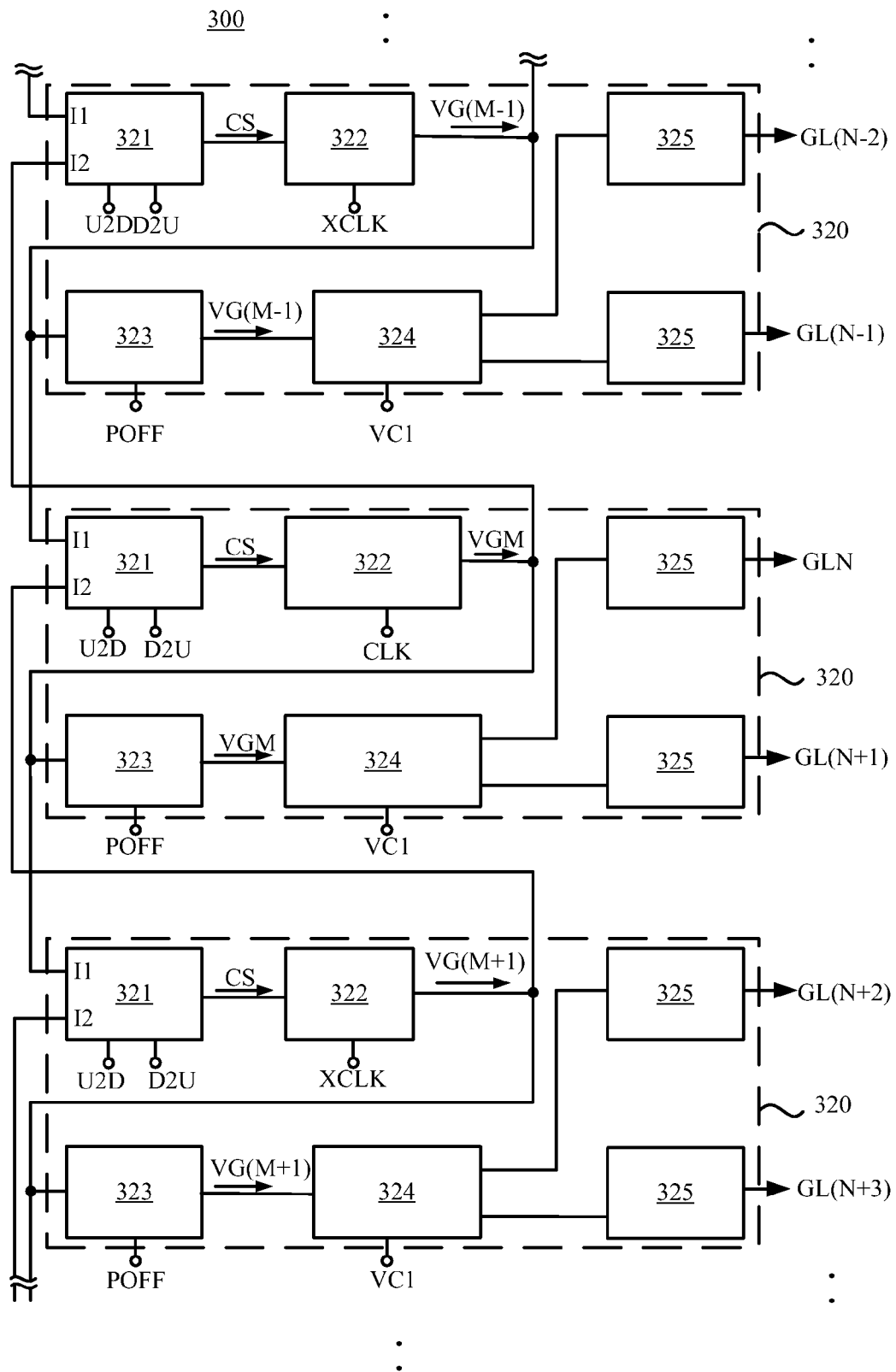
FIG. 3A is a diagram illustrating a gate driver according to an embodiment of the present disclosure.

FIG. 3A is a diagram illustrating a gate driver according to an embodiment of the present disclosure. As shown in FIG. 3A, gate driver 300 includes a plurality of drive circuits 320. In the present embodiment, each drive circuit 320 is configured to drive two gate lines (e.g., gate lines GLN and GL(N+1)). Each drive circuit 320 includes an input unit 321, a shift register unit 322, a control unit 323, and a select unit 324.

The T-th drive circuit 320 is taken as an example in the following explanation, in which T is a positive integer. In terms of the structure, input unit 321 includes a first transmission terminal 11, a second transmission terminal 12, a first input terminal, and a second input terminal, in which the first input terminal of input unit 321 is configured to receive an upshift signal D2U and the second input terminal of input unit 321 is configured to receive a downshift signal U2D.

A first input terminal of shift register unit 322 is electrically coupled to the output terminal of input unit 321, a second input terminal of shift register unit 322 is configured to receive a system clock signal CLK, and an output terminal of shift register unit 322 is electrically coupled to the second transmission terminal 12 of (T−1)-th drive circuit 320 and to the first transmission terminal 11 of (T+1)-th drive circuit 320.

A first input terminal of control unit 323 is electrically coupled to the output terminal of shift register unit 322, and a second input terminal of control unit 323 is configured to receive a power signal POFF.

A first input terminal of select unit 324 is electrically coupled to the output terminal of control unit 323, a second input terminal of select unit 324 is configured to receive first clock signal VC1, a first output terminal of select unit 324 is electrically coupled to gate line GLN, and a second output terminal of select unit 324 is electrically coupled to gate line GL(N+1). In the present embodiment, input unit 321 is configured to generate a scan control signal CS according to downshift signal U2D and upshift signal D2U, in which upshift signal D2U is in opposite phase to downshift signal U2D. In implementation, gate driver 300 is configured to drive gate lines GLX-GL1 sequentially from bottom to top or drive gate lines GL1-GLX sequentially from top to bottom according to practical needs, and this may be implemented by setting upshift signal D2U and downshift signal U2D.

Shift register unit 322 is configured to generate driving signal VGM according to scan control signal CS. Control unit 323 is configured to pull up driving signal VGM to a high voltage level according to power signal POFF when drive circuit 320 is abnormal powered off (e.g., when the power supply is unstable or a sudden power failure occurs), to reset the plurality of pixels 124 in image display area 240.

Select unit 324 is configured to receive driving signal VGM and to output driving signal VGM to gate line GLN or to gate line GL(N+1) according to first clock signal VC1, in which the enabling interval of driving signal VGM is an N-th power of 2 times the period of first clock signal VC1, in which N is zero or a positive integer. In the present embodiment, the enabling interval of driving signal VGM is equal to the period of first clock signal VC1.

Figure 3B:
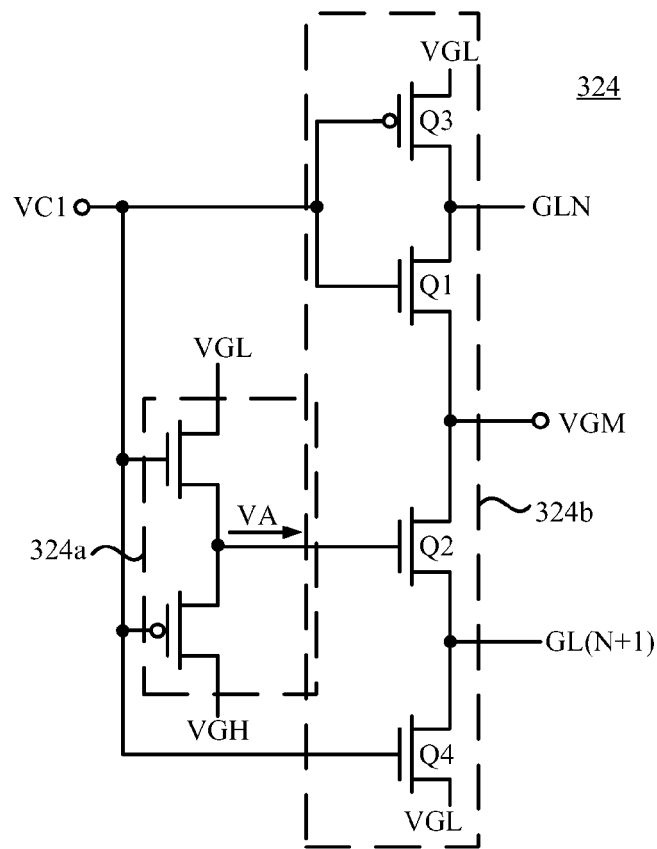
FIG. 3B is a circuit diagram illustrating a select unit of FIG. 3A according to an embodiment of the present disclosure.

FIG. 3B is a circuit diagram illustrating the select unit of FIG. 3A according to an embodiment of the present disclosure. As shown in FIG. 3B, select unit 324 includes an inverter 324a and a de-multiplexer circuit 324b. De-multiplexer circuit 324b is electrically coupled to inverter 324a, is configured to output driving signal VGM to gate line GLN when first clock signal VC1 is at a high voltage level, and is further configured to output driving signal VGM to gate line GL(N+1) when first clock signal VC1 is at a low voltage level.

Specifically, de-multiplexer circuit 324b includes a switch Q1, a switch Q2, a switch Q3, and a switch Q4. The input terminal of inverter 324a is electrically coupled to the second input terminal of select unit 324 and is configured to receive first clock signal VC1. The first terminal of switch Q1 is electrically coupled to the first output terminal of select unit 324 and to gate line GLN. The second terminal of switch Q1 is electrically coupled to the first input terminal of select unit 324 and is configured to receive driving signal VGM. The control terminal of switch Q1 is electrically coupled to the second input terminal of select unit 324 and is configured to receive first clock signal VC1. The first terminal of switch Q2 is electrically coupled to the first input terminal of select unit 324 and is configured to receive driving signal VGM. The second terminal of switch Q2 is electrically coupled to the second output terminal of select unit 324 and to gate line GL(N+1). The control terminal of switch Q2 is electrically coupled to the output terminal of the inverter 324a and is configured to receive control signal VA. The first terminal of switch Q3 is configured to receive a voltage VGL. The second terminal of switch Q3 is electrically coupled to the first terminal of switch Q1. The control terminal of switch Q3 is electrically coupled to the second input terminal of select unit 324 and is configured to receive first clock signal VC1. The first terminal of switch Q4 is electrically coupled to the second terminal of switch Q2. The second terminal of switch Q4 is configured to receive voltage VGL. The control terminal of switch Q4 is electrically coupled to the second input terminal of select unit 324 and is configured to receive first clock signal VC1.

As shown in FIG. 3B, inverter 324a is configured to generate control signal VA according to first clock signal VC1, in which control signal VA is in opposite phase to first clock signal VC1. Switch Q1 is configured to be ON according to first clock signal VC1 and to output driving signal VGM to gate line GLN. Switch Q2 is configured to be ON according to control signal VA and to output driving signal VGM to gate line GL(N+1). Switch Q3 is configured to pull down the voltage level of gate line GLN to a low voltage level (e.g., the voltage level of voltage VGL) when switch Q1 is OFF. Switch Q4 is configured to pull down the voltage level of gate line GL(N+1) to the low voltage level (e.g., the voltage level of voltage VGL) when switch Q2 is OFF.

In addition, as shown in FIG. 3A, in the aforementioned embodiments, gate driver 300 may further include a plurality of buffers 325. Each buffer 325 is electrically coupled between corresponding drive circuit 320 and corresponding gate line GL1-GLX, and is configured to improve the driving ability of driving signal VGM. For instance, as shown in FIG. 3A, the T-th drive circuit 320 includes a buffer 325 ("first buffer" hereinafter) and another buffer 325 ("second buffer" hereinafter). The input terminal of first buffer 325 is electrically coupled to the first output terminal of select unit 324, and the output terminal of first buffer 325 is electrically coupled to gate line GLN. The input terminal of second buffer 325 is electrically coupled to the second output terminal of select unit 324, and the output terminal of second buffer 325 is electrically coupled to gate line GL(N+1).

Figure 3C:
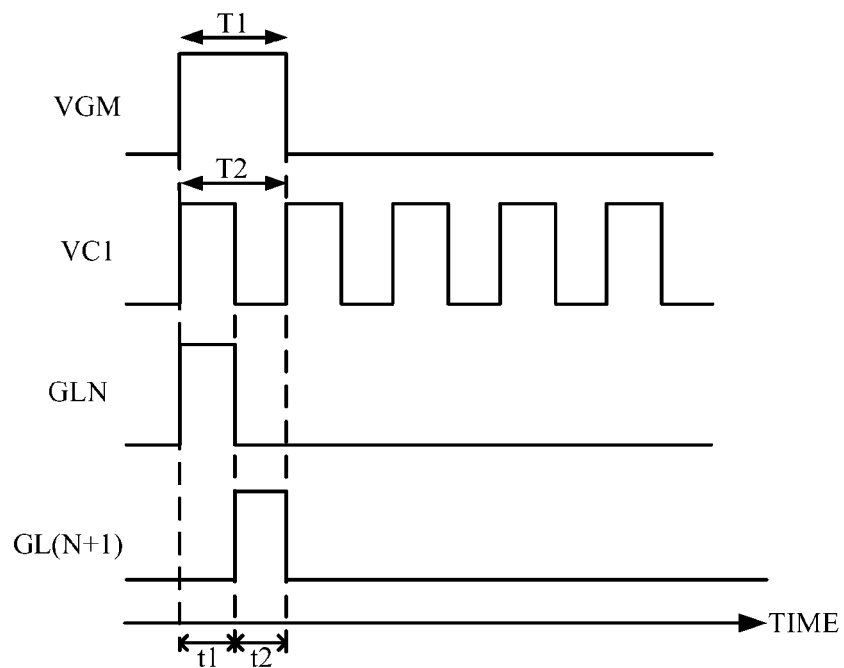
FIG. 3C is a waveform diagram illustrating the operation of the select unit of FIG. 3B according to an embodiment of the present disclosure.

FIG. 3C is a waveform diagram illustrating the operation of the select unit of FIG. 3B according to an embodiment of the present disclosure. It is noted that, in the present embodiment, enabling interval T1 (e.g., the time with a high voltage level) of driving signal VGM is the same as a period T2 of first clock signal VC1.

Referring to FIG. 3B and FIG. 3C, at time t1, first clock signal VC1 is at the high voltage level and inverter 324a is configured to generate control signal VA at the low voltage level (not shown in FIG. 3C). In this state, switch Q1 and switch Q4 are ON while switch Q2 and switch Q3 are OFF, and inverter 324a is configured to output driving signal VGM to gate line GLN and to keep the voltage level of gate line GL(N+1) at the low voltage level.

At time t2, first clock signal VC1 is switched to the low voltage level and control signal VA is switched to the high voltage level correspondingly. In this state, switch Q1 and switch Q4 are OFF while switch Q2 and switch Q3 are ON, and inverter 324a is configured to output driving signal VGM to gate line GL(N+1) and to pull down the voltage level of gate line GLN to the low voltage level. Therefore, the aforementioned gate driver 300 may be configured to drive gate lines GLN and GL(N+1) sequentially according to first clock signal VC1 and driving signal VGM.

Figure 4A:
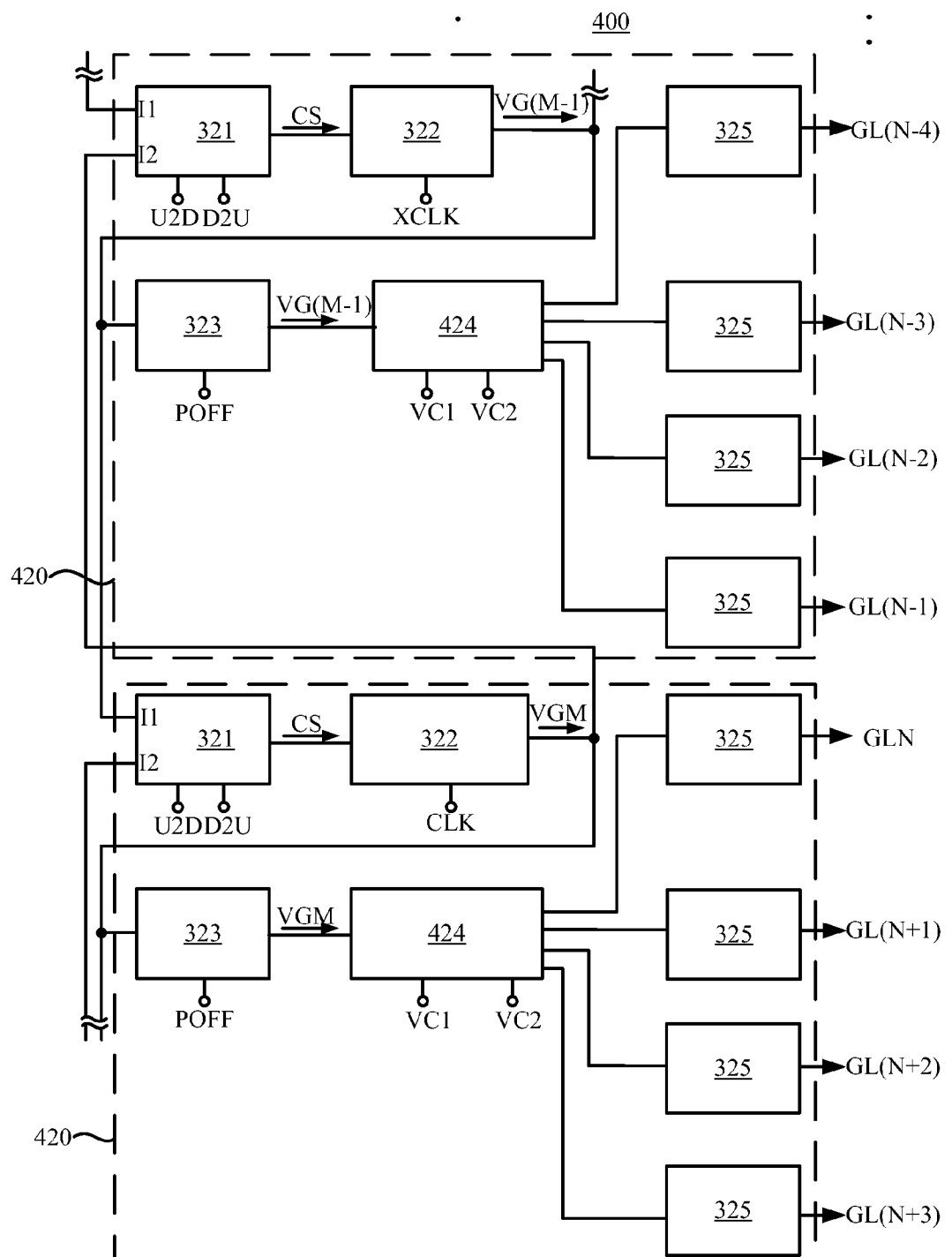
FIG. 4A is a diagram illustrating a gate driver according to an embodiment of the present disclosure.

FIG. 4A is a diagram illustrating a gate driver according to an embodiment of the present disclosure. As shown in FIG. 4A, gate driver 400 includes a plurality of drive circuits 420. Compared to the drive circuits in FIG. 3A, in the present embodiment, each drive circuit 420 is configured to drive at least 4 gate lines (e.g., gate lines GLN, GL(N+1), GL(N+2) and GL(N+3)). Therefore, compared to the aforementioned gate driver 300 with the same number of gate lines, gate driver 400 in the present embodiment may drive gate lines GL1-GLX sequentially with fewer drive circuits 420.

In the present embodiment, drive circuit 420 includes input unit 321, shift register unit 322, control unit 323, a select unit 424, and buffer 325, in which the functions and the connection relationships of input unit 321, shift register unit 322, control unit 323, and buffer 325 are the same as those described with reference to and illustrated in FIG. 3A and are omitted herein for the sake of the brevity.

In the present embodiment, circuit 420 is taken as an example. Compared to the aforementioned drive circuit 320, circuit 420 further includes a third input terminal, a third output terminal and a fourth output terminal. Specifically, the third input terminal of select unit 424 is configured to receive a second clock signal VC2. The third output terminal of select unit 424 is electrically coupled to gate line GL(N+2), and the fourth output terminal of select unit 424 is electrically coupled to gate line GL(N+3).

Figure 4B:
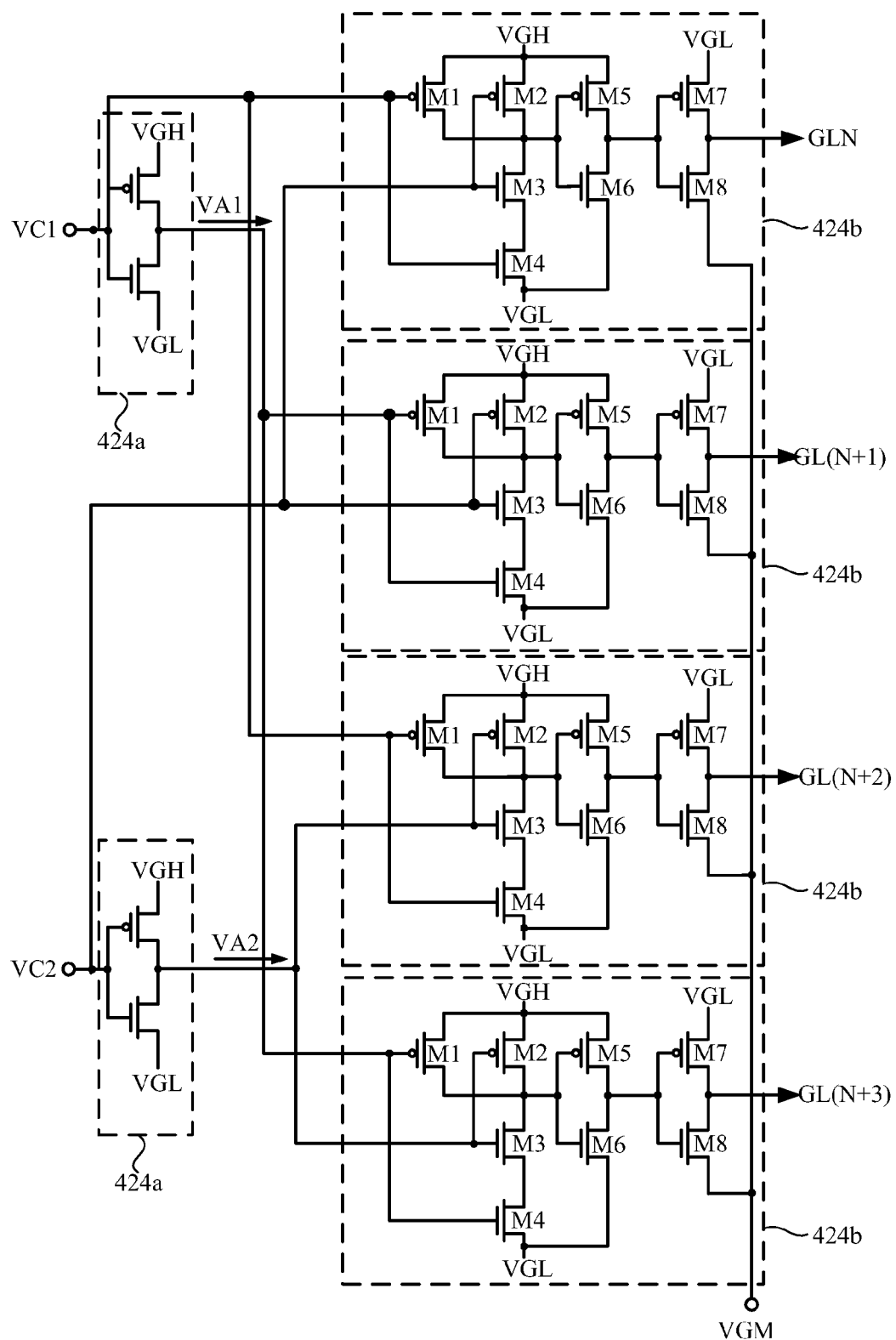
FIG. 4B is a circuit diagram illustrating a select unit of FIG. 4A according to an embodiment of the present disclosure.

FIG. 4B is a circuit diagram illustrating a select unit of FIG. 4A according to an embodiment of the present disclosure. As shown in FIG. 4B, each select unit 424 includes two inverters 424a and a plurality of de-multiplexer circuits 424b. Specifically, the input terminal of one inverter 424a is electrically coupled to the second input terminal of select unit 424 and is configured to receive first clock signal VC1. The input terminal of another inverter 424a is electrically coupled to the third input terminal of select unit 424 and is configured to receive second clock signal VC2.

In addition, each de-multiplexer circuit 424b includes a first input terminal, a second input terminal, a third input terminal, a fourth input terminal, a fifth input terminal, and an output terminal. The first input terminal of each de-multiplexer circuit 424b is configured to receive voltage VGL, and the second input terminal of each de-multiplexer circuit 424b is configured to receive voltage VGH, in which the voltage level of voltage VGH is higher than of voltage VGL. The third input terminal of each de-multiplexer circuit 424b is electrically coupled to the first input terminal of select unit 424 and is configured to receive driving signal VGM. The fourth input terminal and the fifth input terminals of each de-multiplexer circuit 424b is electrically coupled to the input terminal or the output terminal of first inverter 424a and the input terminal or the output terminal of second inverter 424a, respectively, according to different operations of de-multiplexer circuits 424b.

In operation, one inverter 424a is configured to receive first clock signal VC1 and to generate control signal VA1. Alternatively stated, control signal VA1 is in opposite phase to first clock signal VC1. Another inverter 424a is configured to receive second clock signal VC2 and to generate control signal VA2. Alternatively stated, control signal VA2 is in opposite phase to second clock signal VC2.

The first de-multiplexer circuit 424b is configured to receive driving signal VGM and to output driving signal VGM to gate line GLN when first clock signal VC1 and second clock signal VC2 are both at the high voltage level (e.g., at voltage VGH). The second de-multiplexer circuit 424b is configured to receive driving signal VGM and to output driving signal VGM to gate line GL(N+1) when control signal VA1 and second clock signal VC2 are both at the high voltage level. The third de-multiplexer circuit 424b is configured to receive driving signal VGM and to output driving signal VGM to gate line GL(N+2) when first clock signal VC1 and control signal VA2 are both at the high voltage level. The fourth de-multiplexer circuit 424b is configured to receive driving signal VGM and to output driving signal VGM to gate line GL(N+3) when control signal VA1 and control signal VA2 are both at the high voltage level.

As shown in FIG. 4B, the first to fourth de-multiplexer circuits 424b share similar circuit structures, and in the following paragraphs the first de-multiplexer circuit 424b is taken as an example for further explanation.

In the present embodiment, de-multiplexer circuit 424b includes a switch M1, a switch M2, a switch M3, a switch M4, a switch M5, a switch M6, a switch M7, and a switch M8.

In terms of structure, the first terminal of switch M1 is electrically coupled to the second input terminal of the first de-multiplexer circuit 424b and is configured to receive voltage VGH. The control terminal of switch M1 is electrically coupled to the fourth input terminal of the first de-multiplexer circuit 424b (i.e., the input terminal of inverter 424a) and is configured to receive first clock signal VC1. The first terminal of switch M2 is electrically coupled to the second input terminal of the first de-multiplexer circuit 424b and is configured to receive voltage VGH. The second terminal of switch M2 is electrically coupled to the second terminal of switch M1. The control terminal of switch M2 is electrically coupled to the fifth input terminal of the first de-multiplexer circuit 424b and is configured to receive second clock signal VC2. The first terminal of switch M3 is electrically coupled to the second terminal of switch M2. The control terminal of switch M3 is electrically coupled to the fifth input terminal of the first de-multiplexer circuit 424b and is configured to receive second clock signal VC2. The first terminal of switch M4 is electrically coupled to the second terminal of switch M3. The second terminal of switch M4 is electrically coupled to the first input terminal of the first de-multiplexer circuit 424b and is configured to receive the voltage VGL. The control terminal of switch M4 is electrically coupled to the fourth input terminal of the first de-multiplexer circuit 424b and is configured to receive first clock signal VC1.

In addition, the first terminal of switch M5 is electrically coupled to the second input terminal of the first de-multiplexer circuit 424b and is configured to receive the voltage VGH. The control terminal of switch M5 is electrically coupled to the second terminal of switch M2. The first terminal of switch M6 is electrically coupled to the second terminal of switch M5. The second terminal of switch M6 is electrically coupled to the first input terminal of the first de-multiplexer circuit 424b and is configured to receive the voltage VGL. The control terminal of switch M6 is electrically coupled to the second terminal of switch M2. The first terminal of switch M7 is electrically coupled to the first input terminal of the first de-multiplexer circuit 424b and is configured to receive the voltage VGL. The second terminal of switch M7 is electrically coupled to the output terminal of the first de-multiplexer circuit 424b and to gate line GLN. The control terminal of switch M7 is electrically coupled to the second terminal of switch M5. The first terminal of switch M8 is electrically coupled to the second terminal of switch M7. The second terminal of switch M8 is electrically coupled to the third input terminal of the first de-multiplexer circuit 424b and is configured to receive driving signal VGM. The control terminal of switch M8 is electrically coupled to the second terminal of switch M5.

Figure 4C:
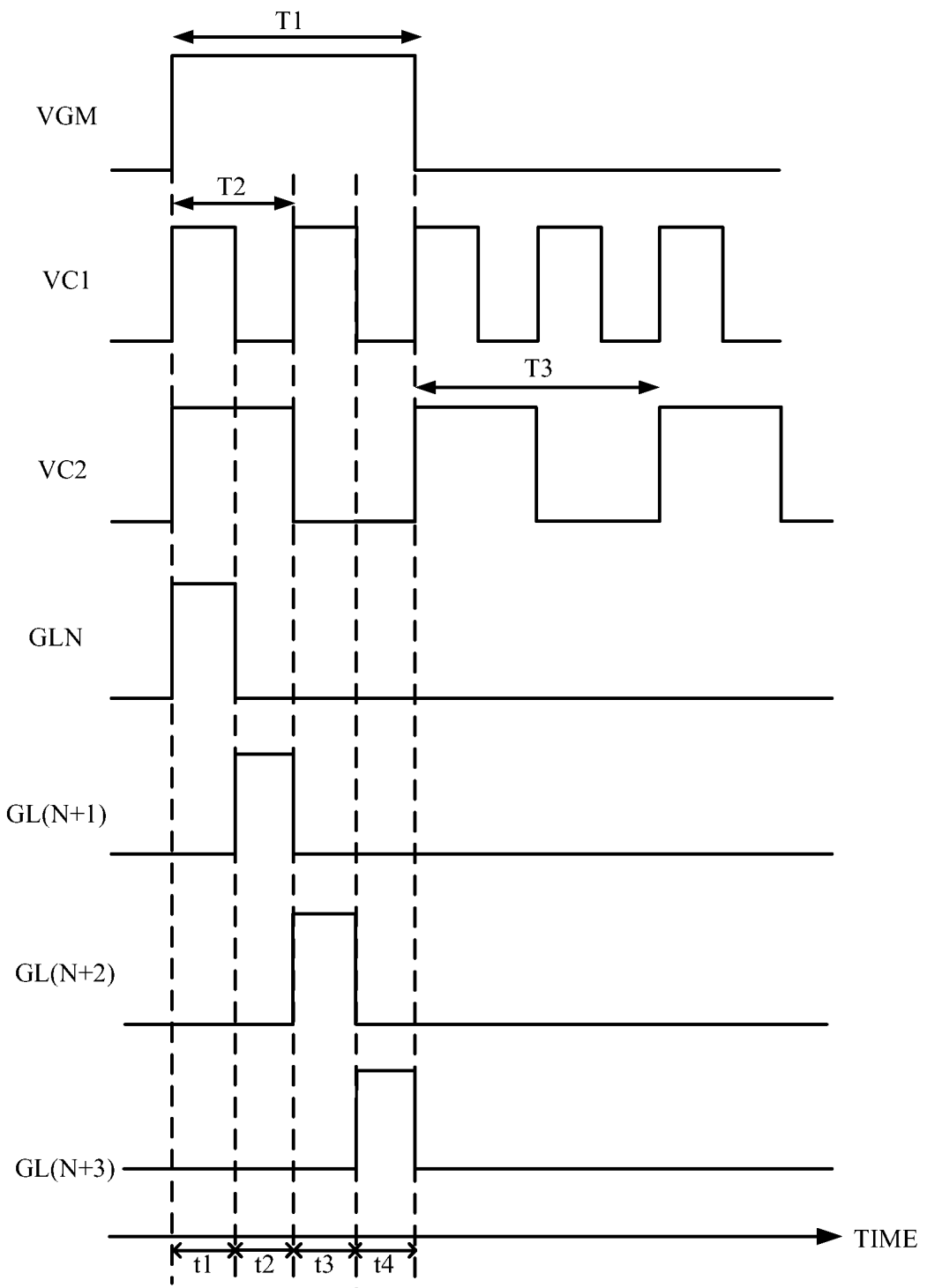
FIG. 4C is a waveform diagram illustrating the operation of the select unit of FIG. 4B according to an embodiment of the present disclosure.

FIG. 4C is a waveform diagram illustrating the operation of the select unit of FIG. 4B according to an embodiment of the present disclosure. In the present embodiment, enabling interval T1 of driving signal VGM is two times the period T2 of first clock signal VC1, and enabling interval T1 of driving signal VGM is configured to be the same as the period T3 of second clock signal VC2.

Referring to FIG. 4B and FIG. 4C, at time t1, first clock signal VC1 and second clock signal VC2 are both at the high voltage level. In this state, switches M1, M3, and M4 of the first de-multiplexer circuit 424b are configured to be ON and to pull down the voltage level of control terminals of switches M5 and M6 of the first de-multiplexer circuit 424b to the voltage VGL, and thus, switch M8 of the first de-multiplexer circuit 424b is configured to be ON and the first de-multiplexer circuit 424b is configured to output driving signal VGM to gate line GLN.

At time t2, first clock signal VC1 is switched to the low voltage level while second clock signal VC2 is kept at the high voltage level. In this state, the first inverter 424a is configured to output control signal VA1 with the high voltage level. At time t2, switches M1, M3, and M4 of the second de-multiplexer circuit 424b are configured to be ON and switch M8 of the second de-multiplexer circuit 424b is configured to be ON and the second de-multiplexer circuit 424b is configured to output driving signal VGM to gate line GL(N+1).

At time t3, first clock signal VC1 is at the high voltage level while second clock signal VC2 is at the low voltage level. In this state, the second inverter 424a is configured to output control signal VA2 with the high voltage level. Thus, switches M1, M3, and M4 of the third de-multiplexer circuit 424b are configured to be ON and switch M8 of the third de-multiplexer circuit 424b is configured to be ON and the third de-multiplexer circuit 424b is configured to output driving signal VGM to gate line GL(N+2).

Similarly, at time t4, first clock signal VC1 and second clock signal VC2 are both at the low voltage level. In this state, the first inverter 424a and the second inverter 424a are configured to output control signal VA1 and control signal VA2 with the high voltage level, respectively. Thus, switches M1, M3, and M4 of the fourth de-multiplexer circuit 424b are configured to be ON, switch M8 of the fourth de-multiplexer circuit 424b is configured to be ON and the fourth de-multiplexer circuit 424b is configured to output driving signal VGM to gate line GL(N+3).

Therefore, each drive circuit of the gate driver in the aforementioned embodiments of the present disclosure is configured to be able to drive at least two gate lines. Therefore, the circuit area of the gate driver is reduced and the resulting display panels are applicable to products with slim borders. The numbers of gate lines in the aforementioned embodiments are used for illustration purposes only and are not meant to be limitations of the present disclosure. It will be apparent to one of ordinary skill in the art that it is possible to drive more gate lines and the numbers of gate lines to be driven may be set differently according to practical needs.

Figure 5A:
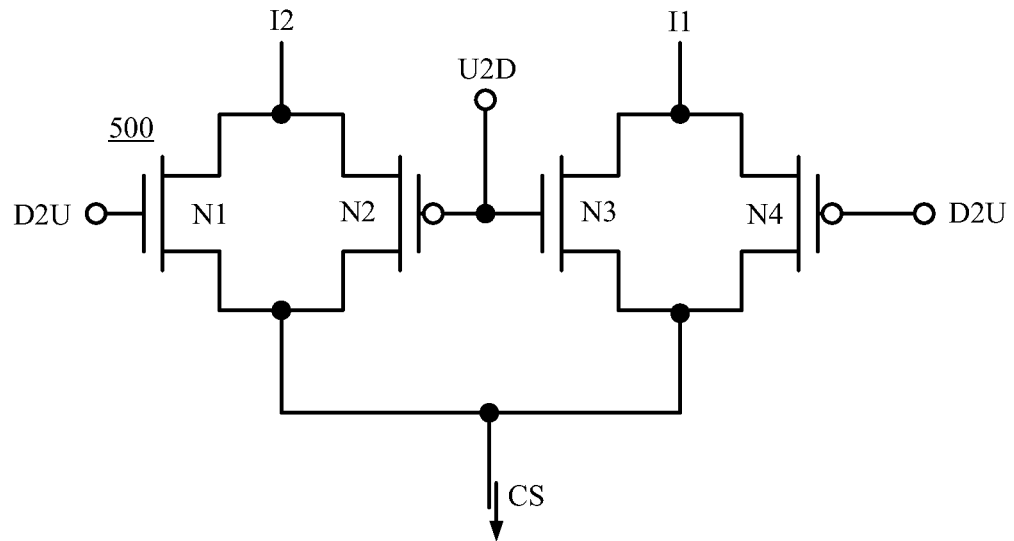
FIG. 5A is a diagram illustrating an input unit according to an embodiment of the present disclosure.

FIG. 5A is a diagram illustrating an input unit according to an embodiment of the present disclosure. As shown in FIG. 5A, input unit 500 includes a switch N1, a switch N2, a switch N3, and a switch N4, each of which has a first terminal, a second terminal, and a control terminal. The first terminal of switch N1 is electrically coupled to a second transmission terminal 12 of input unit 500. The second terminal of switch N1 is electrically coupled to an output terminal of input unit 500 and is configured to output a scan control signal CS. The control terminal of switch N1 is electrically coupled to a first input terminal of input unit 500 and is configured to receive upshift signal D2U. The first terminal of switch N2 is electrically coupled to second transmission terminal 12 of input unit 500. The second terminal of switch N2 is electrically coupled to the output terminal of input unit 500 and is configured to output scan control signal CS. The control terminal of switch N2 is electrically coupled to a second input terminal of input unit 500 and is configured to receive downshift signal U2D. The first terminal of switch N3 is electrically coupled to first transmission terminal 11 of input unit 500. The second terminal of switch N3 is electrically coupled to the output terminal of input unit 500 and is configured to output scan control signal CS. The control terminal of switch N3 is electrically coupled to the second input terminal of input unit 500 and is configured to receive downshift signal U2D. The first terminal of switch N4 is electrically coupled to first transmission terminal 11 of input unit 500. The second terminal of switch N4 is electrically coupled to the output terminal of input unit 500 and is configured to output scan control signal CS. The control terminal of switch N1 is electrically coupled to the first input terminal of input unit 500 and is configured to receive upshift signal D2U.

As previously shown in FIG. 3A, first transmission terminal 11 of input unit 500 is configured to receive driving signal VG(M−1) outputted from former drive circuit 320 and second transmission terminal 12 of input unit 500 is configured to receive driving signal VG(M+1) outputted from latter drive circuit 320. For instance, when upshift signal D2U is at the low voltage level and downshift signal U2D is at the high voltage level, switches N1 and N2 are OFF and switches N3 and N4 are ON, and input unit 500 is configured to receive former driving signal VG(M−1) and to output the aforementioned scan control signal CS. Thus gate lines GL1-GLX are scanned from top to bottom in operation.

Figure 5B:
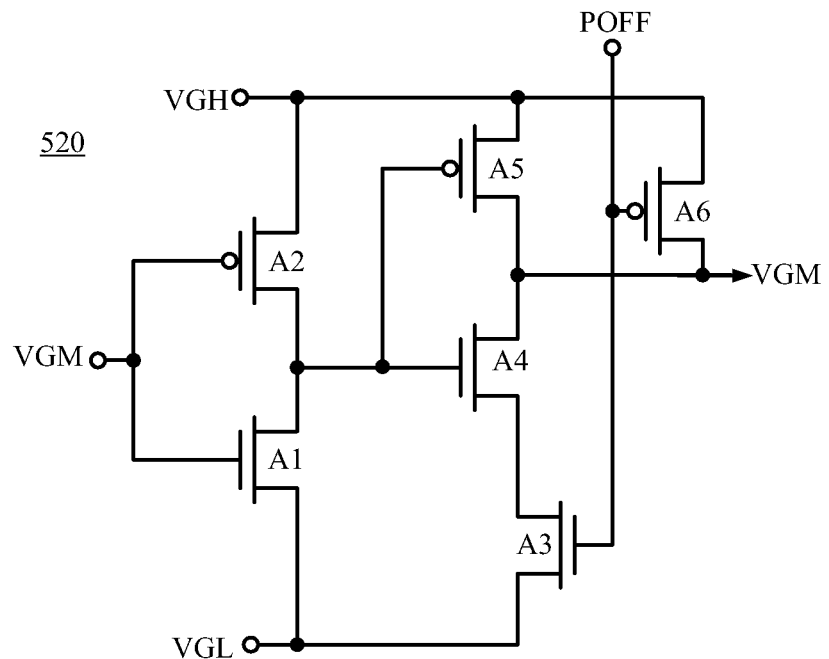
FIG. 5B is a diagram illustrating a control unit according to an embodiment of the present disclosure.

FIG. 5B is a diagram illustrating a control unit according to an embodiment of the present disclosure. As shown in FIG. 5B, control unit 520 includes a switch A1, a switch A2, a switch A3, a switch A4, a switch A5, and a switch A6, each of which has a first terminal, a second terminal, and a control terminal.

Specifically, the second terminal of switch A1 is configured to receive voltage VGL. The control terminal of switch A1 is electrically coupled to the first input terminal of control unit 520 and is configured to receive driving signal VGM. The first terminal of switch A2 is configured to receive voltage VGH. The second terminal of switch A2 is electrically coupled to the first terminal of switch A1. The control terminal of switch A2 is electrically coupled to the control terminal of switch A1. The second terminal of switch A3 is configured to receive voltage VGL. The control terminal of switch A3 is electrically coupled to the second input terminal of control unit 520 and is configured to receive power signal POFF. The first terminal of switch A4 is electrically coupled to the output terminal of control unit 520 and is configured to output driving signal VGM. The second terminal of switch A4 is electrically coupled to the first terminal of switch A3. The control terminal of switch A4 is electrically coupled to the first terminal of switch A1. The first terminal of switch A5 is configured to receive voltage VGH. The second terminal of switch A5 is electrically coupled to the first terminal of switch A4. The control terminal of switch A5 is electrically coupled to the control terminal of switch A4. The first terminal of switch A6 is configured to receive voltage VGH. The second terminal of switch A6 is electrically coupled to the first terminal of switch A4. The control terminal of switch A6 is electrically coupled to the control terminal of switch A3.

In the present embodiment, as mentioned above, power signal POFF is configured to be at the high voltage level in normal operation and control unit 520 is configured to output driving signal VGM normally. When the power of the display panel is powered off, power signal POFF is switched to the low voltage level and switch A6 is configured to be ON and to pull up the voltage level of driving signal VGM to the high voltage level, and the pixels 124 in the display panel are reset.

Figure 5C:
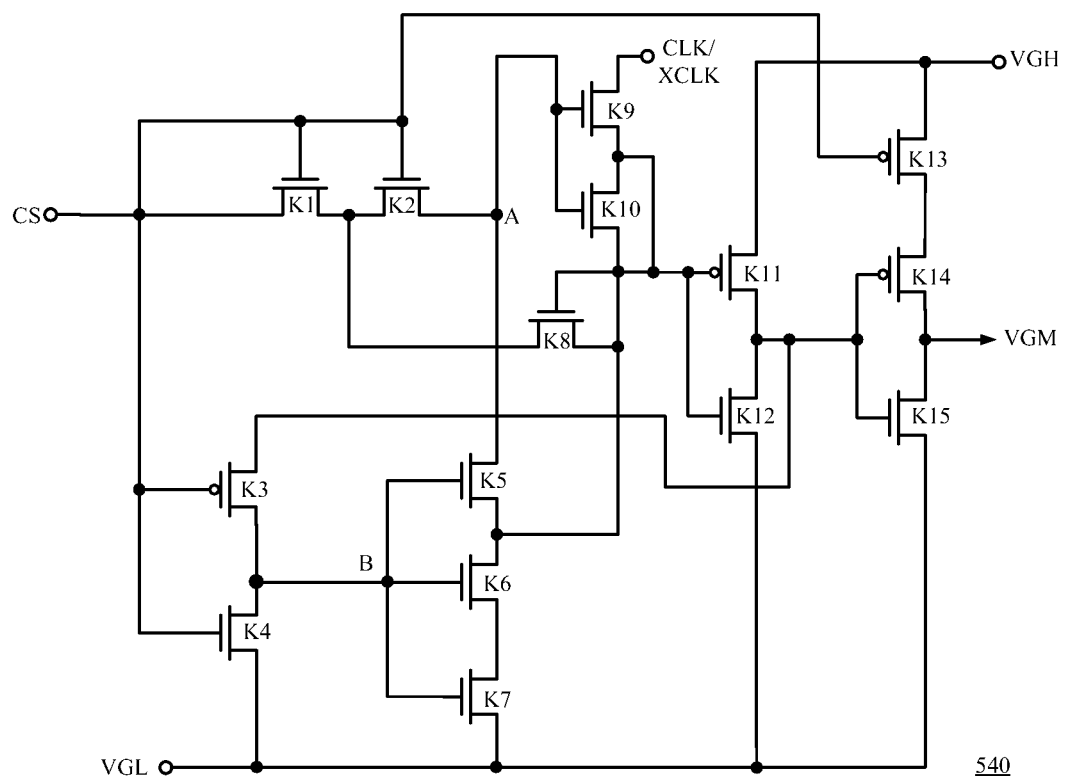
FIG. 5C is a diagram illustrating a shift register unit according to an embodiment of the present disclosure.

FIG. 5C is a diagram illustrating a shift register unit according to an embodiment of the present disclosure. As shown in FIG. 5C, shift register unit 540 includes switches K1 to K15, each of which has a first terminal, a second terminal, and a control terminal.

Specifically, the first terminal of switch K1 is electrically coupled to a first input terminal of shift register unit 540 and is configured to receive scan control signal CS. The control terminal of switch K1 is electrically coupled to the first input terminal of shift register unit 540 and is configured to receive scan control signal CS. The first terminal of switch K2 is electrically coupled to the second terminal of switch K1. The control terminal of switch K2 is electrically coupled to the first input terminal of shift register unit 540 and is configured to receive scan control signal CS. The control terminal of switch K3 is electrically coupled to the first input terminal of shift register unit 540 and is configured to receive scan control signal CS. The first terminal of switch K4 is electrically coupled to the second terminal of switch K3. The second terminal of switch K4 is configured to receive voltage VGL. The control terminal of switch K4 is electrically coupled to the first input terminal of shift register unit 540 and is configured to receive scan control signal CS. The first terminal of switch K5 is electrically coupled to the second terminal of switch K2. The control terminal of switch K5 is electrically coupled to the first terminal of switch K4. The first terminal of switch K6 is electrically coupled to the second terminal of switch K5. The control terminal of switch K6 is electrically coupled to the first terminal of switch K4. The first terminal of switch K7 is electrically coupled to the second terminal of switch K6. The second terminal of switch K7 is configured to receive voltage VGL. The control terminal of switch K7 is electrically coupled to the first terminal of switch K4.

In addition, the first terminal of switch K8 is electrically coupled to the second terminal of switch K1. The second terminal of switch K8 is electrically coupled to the second terminal of switch K5. The control terminal of switch K8 is electrically coupled to the second terminal of switch K5. The first terminal of switch K9 is electrically coupled to a second input terminal of shift register unit 540 and is configured to receive system clock signal CLL/XCLK. The control terminal of switch K9 is electrically coupled to the second terminal of switch K2. The first terminal of switch K10 is electrically coupled to the second terminal of switch K9. The second terminal of switch K10 is electrically coupled to the second terminal of switch K8 and the second terminal of switch K9.

The control terminal of switch K10 is electrically coupled to the second terminal of switch K2. The first terminal of switch K11 is configured to receive voltage VGH. The second terminal of switch K11 is electrically coupled to the first terminal of switch K3. The control terminal of switch K11 is electrically coupled to the second terminal of switch K10. The first terminal of switch K12 is electrically coupled to the second terminal of switch K11. The second terminal of switch K12 is configured to receive voltage VGL. The control terminal of switch K12 is electrically coupled to the second terminal of switch K10. The first terminal of switch K13 is configured to receive voltage VGH. The control terminal of switch K13 is electrically coupled to the first input terminal of shift register unit 540 and is configured to receive scan control signal CS. The first terminal of switch K14 is electrically coupled to the second terminal of switch K13. The second terminal of switch K14 is electrically coupled to the output terminal of shift register unit 540 and is configured to output driving signal VGM. The control terminal of switch K14 is electrically coupled to the first terminal of switch K12. The first terminal of switch K15 is electrically coupled to the second terminal of switch K14. The second terminal of switch K15 is configured to receive voltage VGL. The control terminal of switch K15 is electrically coupled to the first terminal of switch K12.

In terms of operation, when shift register unit 540 receives scan control signal CS, the second terminal of switch K2 (i.e., node A) is charged to the high voltage level. When scan control signal CS is switched to the low voltage level and system clock signal CLK (or XCLK) is switched to the high voltage level, the voltage level of node A is pulled up again, switches K9 and K10 are ON, and shift register unit 540 is configured to output driving signal VGM with the high voltage level.

In addition, when scan control signal CS and system clock signal CLK (or XCLK, which is in opposite phase to CLK) are both at the low voltage level, switch K3 is ON and the voltage level of the control terminal of switch K5 (i.e., node B) is pulled up to the high voltage level, such that switches K5, K6, and K7 are ON. At this moment, the voltage level of node A is pulled down to the low voltage level, and shift register unit 540 is configured to output driving signal VGM with the low voltage level.

In addition, the aforementioned control unit 322 may be configured according to practical applications. Without control unit 322, the output terminal of shift register unit 322 of gate driver 300 may be electrically coupled to the first input terminal of select unit 324 and may be configured to transmit driving signal VGM directly to select unit 324 for subsequent operations, in which the operations are the same as in the aforementioned explanation and an explanation of the same are omitted herein for the sake of the brevity.

In the aforementioned embodiments, switches may be implemented by bipolar junction transistors (BJTs), metal oxide semiconductor field effect transistors (MOSFETs), thin-film transistors (TFTs), or other kinds of transistors, which may be configured by one of ordinary skill in the art, and voltage amplitudes and clock sequences of which may be adjusted according to practical applications and are not meant to be limitations of the present disclosure.

In summary, the display panel and gate driver disclosed herein are configured such that the circuit area of the gate driver is reduced by the select unit and corresponding clock signal configured to drive the plurality of gate lines, and thus the display panel and gate driver may be used in slim border applications.

Although the discourse has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display panel, comprising:
   a plurality of gate lines arranged sequentially from top to bottom; and
   a gate driver configured to drive the plurality of gate lines sequentially, wherein the gate driver comprises a plurality of drive circuits, and a T-th drive circuit of the drive circuits comprises:
      an input unit comprising:
         a first transmission terminal;
         a second transmission terminal;
         a first input terminal configured to receive an upshift signal;
         a second input terminal configured to receive a downshift signal; and
         an output terminal;
      a shift register unit comprising:
         a first input terminal electrically coupled to the output terminal of the input unit;
         a second input terminal configured to receive a system clock signal; and
         an output terminal electrically coupled to the second transmission terminal of a (T−1)-th drive circuit of the drive circuits and the first transmission terminal of a (T+1)-th drive circuit of the drive circuits, wherein T is a positive integer; and
      a select unit comprising:
         a first input terminal electrically coupled to the output terminal of the shift register unit;
         a second input terminal configured to receive a first clock signal;
         a first output terminal electrically coupled to a first gate line of the plurality of gate lines; and
         a second output terminal electrically coupled to a second gate line of the plurality of gate lines.

2. The display panel of claim 1, wherein the select unit comprises:

an inverter comprising an input terminal and an output terminal, wherein the input terminal of the inverter is electrically coupled to the second input terminal of the select unit;
a first switch comprising:
  a first terminal electrically coupled to the first output terminal of the select unit;
  a second terminal electrically coupled to the first input terminal of the select unit; and
  a control terminal electrically coupled to the second input terminal of the select unit;
a second switch comprising:
  a first terminal electrically coupled to the first input terminal of the select unit;
  a second terminal electrically coupled to the second output terminal of the select unit; and
  a control terminal electrically coupled to the output terminal of the inverter;
a third switch comprising:
  a first terminal configured to receive a first voltage;
  a second terminal electrically coupled to the first terminal of the first switch; and
  a control terminal electrically coupled to the second input terminal of the select unit; and
a fourth switch comprising:
  a first terminal electrically coupled to the second terminal of the second switch;
  a second terminal configured to receive the first voltage; and
  a control terminal electrically coupled to the second input terminal of the select unit.

3. The display panel of claim 2, further comprising:
a control unit electrically coupled between the shift register unit and the select unit, comprising:
  a first input terminal electrically coupled to the output terminal of the shift register unit;
  a second input terminal configured to receive a power signal; and
  an output terminal electrically coupled to the first input terminal of the select unit.

4. The display panel of claim 3, wherein the control unit comprises:
a first switch comprising:
  a first terminal;
  a second terminal configured to receive a first voltage; and
  a control terminal electrically coupled to the first input terminal of the control unit;
a second switch comprising:
  a first terminal configured to receive a second voltage;
  a second terminal electrically coupled to the first terminal of the first switch; and
  a control terminal electrically coupled to the control terminal of the first switch;
a third switch comprising:
  a first terminal;
  a second terminal configured to receive the first voltage; and
  a control terminal electrically coupled to the second input terminal of the control unit;
a fourth switch comprising:
  a first terminal electrically coupled to the output terminal of the control unit;
  a second terminal electrically coupled to the first terminal of the third switch; and
  a control terminal electrically coupled to the first terminal of the first switch;
a fifth switch comprising:
  a first terminal configured to receive the second voltage;
  a second terminal electrically coupled to the first terminal of the fourth switch; and
  a control terminal electrically coupled to the control terminal of the fourth switch; and
a sixth switch comprising:
  a first terminal configured to receive the second voltage;
  a second terminal electrically coupled to the first terminal of the fourth switch; and
  a control terminal electrically coupled to the control terminal of the third switch.

5. The display panel of claim 1, wherein the select unit further comprises a third input terminal, a third output terminal, and a fourth output terminal wherein the third input terminal is configured to receive a second clock signal, the third output terminal is electrically coupled to a third gate line of the plurality of gate lines, and the fourth output terminal is electrically coupled to a fourth gate line of the plurality of gate lines, and the select unit comprises:
a first inverter comprising an input terminal and an output terminal, wherein the input terminal of the first inverter is electrically coupled to the second input terminal of the select unit;
a second inverter comprising an input terminal and an output terminal, wherein the input terminal of the second inverter is electrically coupled to the third input terminal of the select unit; and
a plurality of de-multiplexer circuits, wherein each de-multiplexer circuit comprises a first input terminal, a second input terminal, a third input terminal, a fourth input terminal, a fifth input terminal and an output terminal, wherein the first input terminal of the de-multiplexer circuit is configured to receive a first voltage, and the second input terminal of the de-multiplexer circuit is configured to receive a second voltage which is higher than the first voltage, the third input terminal of the de-multiplexer circuit is electrically coupled to the first input terminal of the select unit, the fourth input terminal of the de-multiplexer circuit is electrically coupled to the input terminal or the output terminal of the first inverter, and the fifth input terminal of the de-multiplexer circuit is electrically coupled to the input terminal or the output terminal of the second inverter.

6. The display panel of claim 5, wherein each de-multiplexer circuit comprises:
a first switch comprising:
  a first terminal electrically coupled to the second input terminal of the de-multiplexer circuit;
  a second terminal; and
  a control terminal electrically coupled to the fourth input terminal of the de-multiplexer circuit;
a second switch comprising:
  a first terminal electrically coupled to the second input terminal of the de-multiplexer circuit;
  a second terminal electrically coupled to the second terminal of the first switch; and
  a control terminal electrically coupled to the fifth input terminal of the de-multiplexer circuit;
a third switch comprising:
  a first terminal electrically coupled to the second terminal of the second switch;
  a second terminal; and a control terminal electrically coupled to the fifth input terminal of the de-multiplexer circuit;
a fourth switch comprising:
a first terminal electrically coupled to the second terminal of the third switch;
a second terminal electrically coupled to the first input terminal of the de-multiplexer circuit; and
a control terminal electrically coupled to the fourth input terminal of the de-multiplexer circuit;
a fifth switch comprising:
a first terminal electrically coupled to the second input terminal of the de-multiplexer circuit;
a second terminal; and
a control terminal electrically coupled to the second terminal of the second switch;
a sixth switch comprising:
a first terminal electrically coupled to the second terminal of the fifth switch;
a second terminal electrically coupled to the first input terminal of the de-multiplexer circuit; and
a control terminal electrically coupled to the second terminal of the second switch;
a seventh switch comprising:
a first terminal electrically coupled to the first input terminal of the de-multiplexer circuit;
a second terminal electrically coupled to the output terminal of the de-multiplexer circuit; and
a control terminal electrically coupled to the second terminal of the fifth switch; and
an eighth switch comprising:
a first terminal electrically coupled to the second terminal of the seventh switch;
a second terminal electrically coupled to the third input terminal of the de-multiplexer circuit; and
a control terminal electrically coupled to the second terminal of the fifth switch.

7. The display panel of claim 5, further comprising:
a control unit electrically coupled between the shift register unit and the select unit, wherein the control unit comprises:
a first input terminal electrically coupled to the output terminal of the shift register unit;
a second input terminal configured to receive a power signal; and
an output terminal electrically coupled to the first input terminal of the select unit.

8. The display panel of claim 7, wherein the control unit comprises:
a first switch comprising:
a first terminal;
a second terminal configured to receive a first voltage; and
a control terminal electrically coupled to the first input terminal of the control unit;
a second switch comprising:
a first terminal configured to receive a second voltage;
a second terminal electrically coupled to the first terminal of the first switch; and
a control terminal electrically coupled to the control terminal of the first switch;
a third switch comprising:
a first terminal;
a second terminal configured to receive the first voltage; and
a control terminal electrically coupled to the second input terminal of the control unit;
a fourth switch comprising:
a first terminal electrically coupled to the output terminal of the control unit;
a second terminal electrically coupled to the first terminal of the third switch; and
a control terminal electrically coupled to the first terminal of the first switch;
a fifth switch comprising:
a first terminal configured to receive the second voltage;
a second terminal electrically coupled to the first terminal of the fourth switch; and
a control terminal electrically coupled to the control terminal of the fourth switch; and
a sixth switch comprising:
a first terminal configured to receive the second voltage;
a second terminal electrically coupled to the first terminal of the fourth switch; and
a control terminal electrically coupled to the control terminal of the third switch.

9. The display panel of claim 1, wherein the input unit further comprises:
a first switch comprising:
a first terminal electrically coupled to the second transmission terminal;
a second terminal electrically coupled to the output terminal of the input unit; and
a control terminal electrically coupled to the first input terminal of the input unit;
a second switch comprising:
a first terminal electrically coupled to the second transmission terminal;
a second terminal electrically coupled to the output terminal of the input unit; and
a control terminal electrically coupled to the second input terminal of the input unit;
a third switch comprising:
a first terminal electrically coupled to the first transmission terminal;
a second terminal electrically coupled to the output terminal of the input unit; and
a control terminal electrically coupled to the second input terminal of the input unit; and
a fourth switch comprising:
a first terminal electrically coupled to the first transmission terminal;
a second terminal electrically coupled to the output terminal of the input unit; and
a control terminal electrically coupled to the first input terminal of the input unit.

10. The display panel of claim 1, wherein the shift register unit comprises:
a first switch comprising:
a first terminal electrically coupled to the first input terminal of the shift register unit;
a second terminal; and
a control terminal electrically coupled to the first input terminal of the shift register unit;
a second switch comprising:
a first terminal electrically coupled to the second terminal of the first switch;
a second terminal; and
a control terminal electrically coupled to the first input terminal of the shift register unit;
a third switch comprising:
a first terminal;
a second terminal; and a control terminal electrically coupled to the first input terminal of the shift register unit;
a fourth switch comprising:
  a first terminal electrically coupled to the second terminal of the third switch;
  a second terminal configured to receive a first voltage; and
  a control terminal electrically coupled to the first input terminal of the shift register unit;
a fifth switch comprising:
  a first terminal electrically coupled to the second terminal of the second switch;
  a second terminal; and
  a control terminal electrically coupled to the first terminal of the fourth switch;
a sixth switch comprising:
  a first terminal electrically coupled to the second terminal of the fifth switch;
  a second terminal; and
  a control terminal electrically coupled to the first terminal of the fourth switch;
a seventh switch comprising:
  a first terminal electrically coupled to the second terminal of the sixth switch;
  a second terminal configured to receive the first voltage; and
  a control terminal electrically coupled to the first terminal of the fourth switch;
an eighth switch comprising:
  a first terminal electrically coupled to the second terminal of the first switch;
  a second terminal electrically coupled to the second terminal of the fifth switch; and
  a control terminal electrically coupled to the second terminal of the fifth switch;
a ninth switch comprising:
  a first terminal electrically coupled to the second input terminal of the shift register unit;
  a second terminal; and
  a control terminal electrically coupled to the second terminal of the second switch;
a tenth switch comprising:
  a first terminal electrically coupled to the second terminal of the ninth switch;
  a second terminal electrically coupled to the second terminal of the eighth switch and the second terminal of the ninth switch; and
  a control terminal electrically coupled to the second terminal of the second switch;
an eleventh switch comprising:
  a first terminal configured to receive a second voltage, which is higher than the first voltage;
  a second terminal electrically coupled to the first terminal of the third switch; and
  a control terminal electrically coupled to the second terminal of the tenth switch;
a twelfth switch comprising:
  a first terminal electrically coupled to the second terminal of the eleventh switch;
  a second terminal configured to receive the first voltage; and
  a control terminal electrically coupled to the second terminal of the tenth switch;
a thirteenth switch comprising:
  a first terminal configured to receive the second voltage;
  a second terminal; and
  a control terminal electrically coupled to the first input terminal of the shift register unit;
a fourteenth switch comprising:
  a first terminal electrically coupled to the second terminal of the thirteenth switch;
  a second terminal electrically coupled to the output terminal of the shift register unit; and
  a control terminal electrically coupled to the first terminal of the twelfth switch; and
a fifteenth switch comprising:
  a first terminal electrically coupled to the second terminal of the fourteenth switch;
  a second terminal configured to receive the first voltage; and
  a control terminal electrically coupled to the first terminal of the twelfth switch.

* * * * *